(12) United States Patent
Kim et al.

(10) Patent No.: US 11,791,184 B2
(45) Date of Patent: Oct. 17, 2023

(54) SEMICONDUCTOR FABRICATION PROCESS AND METHOD OF OPTIMIZING THE SAME

(71) Applicant: SAMSUNG ELECTRONICS CO., LTD., Suwon-si (KR)

(72) Inventors: Jiho Kim, Suwon-si (KR); Minhyeok Kwon, Suwon-si (KR); Shigenobu Maeda, Seongnam-si (KR); Jooyeok Seo, Suwon-si (KR); Minuk Lee, Suwon-si (KR)

(73) Assignee: SAMSUNG ELECTRONICS CO., LTD., Yongin-si (KR)

( * ) Notice: Subject to any disclaimer, the term of this patent is extended or adjusted under 35 U.S.C. 154(b) by 0 days.

(21) Appl. No.: 17/719,722

(22) Filed: Apr. 13, 2022

(65) Prior Publication Data
US 2023/0023762 A1    Jan. 26, 2023

(30) Foreign Application Priority Data
Jul. 26, 2021    (KR) ........................ 10-2021-0097892

(51) Int. Cl.
*H01L 21/67* (2006.01)
*G05B 19/418* (2006.01)

(52) U.S. Cl.
CPC .. *H01L 21/67276* (2013.01); *G05B 19/41865* (2013.01); *G05B 2219/32291* (2013.01);
(Continued)

(58) Field of Classification Search
CPC .... G05B 19/41865; G05B 2219/32291; G05B 2219/33034; G05B 2219/45031; H01L 21/67276
See application file for complete search history.

(56) References Cited

U.S. PATENT DOCUMENTS

2004/0098161 A1* 5/2004 Hayashi ............... G05B 23/024
700/121
2006/0129257 A1    6/2006 Chen et al.
(Continued)

FOREIGN PATENT DOCUMENTS

KR         10-1752575         6/2017
KR      10-2019-0021877       3/2019
(Continued)

*Primary Examiner* — Kidest Bahta
(74) *Attorney, Agent, or Firm* — F. Chau & Associates, LLC (57) ABSTRACT

The program code, when executed by a processor, causes the processor to input fabrication data including a plurality of parameters associated with a semiconductor fabricating process to a framework to generate a first class for analyzing the fabrication data, to extract a first parameter targeted for analysis and a second parameter associated with the first parameter from the plurality of parameters and generate a second class for analyzing the first parameter as a sub class of the first class, to modify the first parameter and the second parameter into a data structure having a format appropriate to store in the second class, so as to be stored in the second class, to perform data analysis on the first parameter and the second parameter, to transform the first parameter and the second parameter into corresponding tensor data, and to input the tensor data to the machine learning model.

20 Claims, 10 Drawing Sheets

(52) U.S. Cl.
CPC .............. *G05B 2219/33034* (2013.01); *G05B 2219/45031* (2013.01)

(56) References Cited

U.S. PATENT DOCUMENTS

| | | | | |
|---|---|---|---|---|
| 2007/0155123 | A1* | 7/2007 | Hong | ..................... H10B 10/00 438/622 |
| 2013/0338808 | A1* | 12/2013 | Baseman | ......... G05B 19/41875 700/97 |
| 2017/0109646 | A1* | 4/2017 | David | ................. G03F 7/70625 |
| 2019/0095797 | A1 | 3/2019 | Dhandapani et al. | |
| 2019/0121928 | A1* | 4/2019 | Wu | ........................ H01L 24/97 |
| 2020/0042896 | A1 | 2/2020 | Ko et al. | |
| 2020/0234428 | A1 | 7/2020 | George et al. | |

FOREIGN PATENT DOCUMENTS

| | | |
|---|---|---|
| KR | 10-2019-0081691 | 7/2019 |
| KR | 10-2070913 | 1/2020 |
| KR | 10-2020-0015048 | 2/2020 |
| KR | 10-2020-0047739 | 5/2020 |
| KR | 10-2020-0068534 | 6/2020 |
| KR | 10-2153259 | 9/2020 |

\* cited by examiner

Correlation between
parameter X and parameter Y

FIG. 8B

Yield prediction with
respect to parameter X

FIG. 8C

Defect prediction with respect to parameter X and parameter Y

FIG. 9

SEMICONDUCTOR FABRICATION PROCESS AND METHOD OF OPTIMIZING THE SAME

CROSS-REFERENCE TO RELATED APPLICATIONS

This U.S. non-provisional patent application claims priority under 35 U.S.C. § 119 to Korean Patent Application No. 10-2021-0097892 filed on Jul. 26, 2021, in the Korean Intellectual Property Office, the disclosure of which is incorporated by reference in its entirety herein.

TECHNICAL FIELD

Embodiments of the present disclosure described herein generally relate to a semiconductor fabrication process, and more particularly, relate to optimization of the semiconductor process based on results of the analysis.

DISCUSSION OF RELATED ART

Semiconductor device fabrication is the process used to manufacture semiconductor devices such as metal-oxide-semiconductor (MOS) devices used in integrated circuits (IC) chips. The semiconductor manufacturing process may include a sequence of photolithographic and chemical processing steps during which electronic circuits are gradually created on a wafer made of a semiconducting material such as silicon. Various data may be collected during the manufacturing process and then later analyzed to determine whether the semiconductor manufacturing process needs to be adjusted so that the semiconductor manufacture process can be optimized.

When the data collected during the manufacturing process is too large or complex to be efficiently analyzed using a traditional data processing application, the data may be referred to as Big data. Immediate analysis of the Big data is required for efficient semiconductor fabrication. Machine learning (ML) may be used to analyze the Big data generated during the semiconductor manufacturing process. A ML algorithm builds a model based on sample data (e.g., known as training data) to make predictions or decision without being explicitly programmed to do so.

A high-level understanding of a programming language is required for creating a ML algorithm that can analyze the Big data generated during the semiconductor manufacturing process. A pre-processing process may be performed on the Big data to transform it into a different form suitable for analysis using the ML algorithm. However, a typical semiconductor fabrication engineer lacks sufficient knowledge to create the ML algorithm and the pre-processing process.

SUMMARY

At least one embodiment of the present disclosure provides a framework capable of performing a machine learning algorithm on big data associated with a process of fabricating a semiconductor device, for the purpose of predicting yield and defects of the semiconductor fabricating process.

According to an embodiment, a non-transitory computer-readable medium stores a program code for optimizing a semiconductor fabricating process. The program code includes a framework and a machine learning model. The program code, when executed by a processor, causes the processor to input fabrication data including a plurality of parameters associated with the semiconductor fabricating process to the framework to generate a first class for analyzing the fabrication data, to extract a first parameter targeted for analysis and a second parameter associated with the first parameter from the plurality of parameters to generate a second class for analyzing the first parameter as a sub class of the first class, to modify the first parameter and the second parameter into a data structure having a format appropriate for storage in the second class, to perform data analysis on the data structure to calculate a correlation between the first parameter and the second parameter, to transform the first parameter and the second parameter into a tensor based on correlation, input the tensor to the machine learning model to perform a machine learning algorithm for predicting a characteristic of the semiconductor fabricating process, and changing the semiconductor fabricating process based on the predicted characteristic.

According to an embodiment, a computing device for optimizing a semiconductor fabricating process includes a processor, and a memory. The memory stores a program code including a framework and a machine learning model. The program code, when executed by the processor, causes the processor to input fabrication data including a plurality of parameters associated with the semiconductor fabricating process to the framework to generate a first class for analyzing the fabrication data, to extract a first parameter targeted for analysis and a second parameter associated with the first parameter from the plurality of parameters to generate a second class for analyzing the first parameter as a sub class of the first class, to modify the first parameter and the second parameter into a data structure having a format appropriate for storage in the second class, to perform data analysis on the data structure to calculate a correlation between the first parameter and the second parameter, to transform the first parameter and the second parameter into a tensor based on the correlation, to input the tensor to the machine learning model to perform a machine learning algorithm for predicting a characteristic of the semiconductor fabricating process, and change the semiconductor fabricating process based on the predicted characteristic. The fabrication data may be provided from test equipment measuring characteristics of a plurality of semiconductor chips on a wafer or a database.

According to an embodiment, a method for optimizing a semiconductor fabricating process includes generating a first class for analyzing fabrication data including a plurality of parameters associated with the semiconductor fabricating process, extracting a first parameter targeted for analysis and a second parameter associated with the first parameter from the plurality of parameters to generate a second class for analyzing the first parameter as a sub class of the first class, modifying the first parameter and the second parameter into a data structure having a format appropriate for storage in the second class, performing data analysis on the data structure to generate a correlation between the first parameter and the second parameter, transforming the first parameter and the second parameter into a tensor based on the correlation, performing a machine learning algorithm by inputting the tensor to the machine learning model to predict a characteristic of the semiconductor fabricating process, and changing the semiconductor fabricating process based on the predicted characteristic.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art may implement one or more embodiments of the present disclosure.

In the detailed description, components described with reference to the terms "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
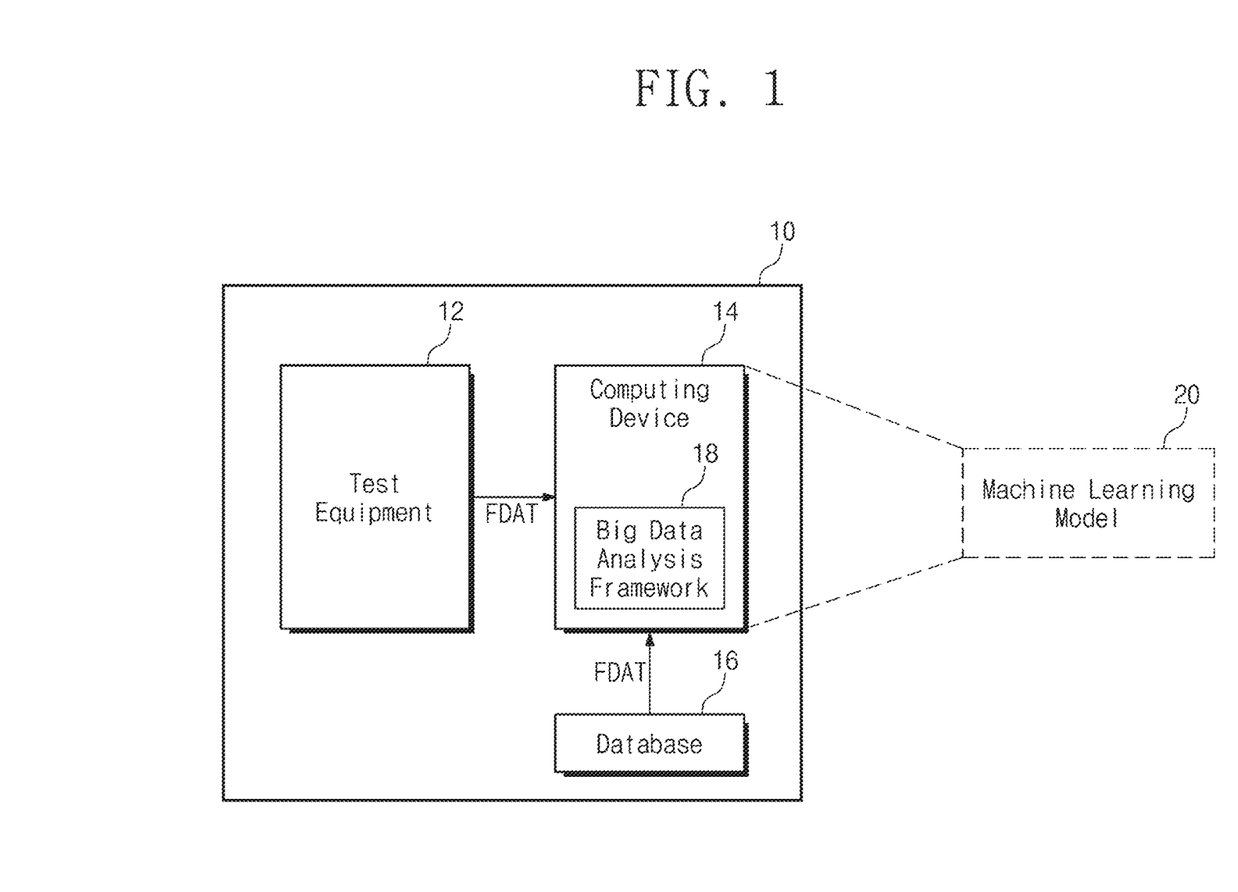
FIG. 1 is a block diagram illustrating a configuration of a system performing big data analysis for semiconductor fabrication, according to an embodiment of the present disclosure.

FIG. 1 is a block diagram illustrating a configuration of a system 10 performing big data analysis for semiconductor fabrication, according to an embodiment of the present disclosure. The system 10 according to an embodiment of the present disclosure may be referred to as a "wafer monitoring system", a "wafer test system", a "semiconductor fabricating process monitoring system", or the like. The system 10 may a perform machine learning algorithm on a plurality of parameters associated with a semiconductor fabricating process to predict the yield and defects of the process.

For example, the plurality of parameters associated with the semiconductor fabricating process may include information about yield, bin, electrical test (ET) parameters, defect, inline measurement data, false detection and classification (FDC), machine, chamber in which processes are performed, and recipe. IC chips from the same wafer may be separated into different quality and/or speed tiers, which are referred to as bins. However, the present disclosure is not limited thereto.

The system 10 may include test equipment 12 that generates fabrication data FDAT including one or more of the plurality of parameters described above, a computing device 14 that extracts parameters from the fabrication data FDAT, transforms the extracted parameters into data appropriate for input to a machine learning model 20, and performs an analysis using a machine learning algorithm, and a database 16 that stores the fabrication data FDAT.

For example, a semiconductor device may be fabricated by applying various processes to a wafer to be used as a substrate by using a semiconductor fabricating device. For example, the wafer may include a material having a semiconductor characteristic, such as silicon (Si) or gallium arsenic (GaAs). For example, the semiconductor fabricating device may sequentially apply the following to the wafer: an etching process, a depositing process, and a planarization process. The semiconductor fabricating device may apply various processes to the wafer to form various semiconductor patterns on the wafer.

The test equipment 12 may test the wafer. In detail, the test equipment 12 may output the fabrication data FDAT associated with the semiconductor fabricating processes by testing and measuring characteristics of a plurality of semiconductor chips formed on the wafer. For example, the characteristics of the plurality of semiconductor chips may include a gate-induced drain leakage (GIDL), a drain-induced barrier lowering (DIBL), a current, a power, an operating frequency, a threshold voltage, a latency, a timing margin, a lifetime, etc. of each of the semiconductor chips. The test equipment 12 may provide the fabrication data FDAT to the computing device 14.

The computing device 14 may receive the fabrication data FDAT from the test equipment 12 or the database 16, may transform the fabrication data FDAT to a format appropriate for being input to the machine learning model 20, may train the machine learning model 20, and may execute the machine learning model 20. In particular, the computing device 14 may include a big data analysis framework 18 that extracts and processes data (i.e., a parameter(s)) targeted for analysis among the fabrication data FDAT, trains the machine learning model 20, and executes the machine learning model 20. In an embodiment, the big data analysis framework 18 is a software framework. In an embodiment, a software framework is a software providing generic functionality that can be selectively changed by additional user-written code, thereby providing application-specific software.

For example, the big data analysis framework 18 may calculate a correlation between parameters included in the fabrication data FDAT. For example, the correlation may be calculated by using a Pearson correlation coefficient, but the present disclosure is not limited thereto. For example, the big data analysis framework 18 may be implemented as a program code for performing the above-described operations. The program code may be executable code that is executable by a processor of the computing device 14 or interpreted by an interpreter of the processor.

The machine learning model 20 may receive an appropriate form of data generated based on the fabrication data FDAT to predict the yield and/or defects of the semiconductor fabricating process. The machine learning model 20 may be trained or executed in response to the program code of the big data analysis framework 18. The machine learning model 20 may adopt various machine learning algorithms for the purpose of predicting the yield and defects.

For example, the machine learning algorithms may include at least one of support vector machine (SVM), k-nearest neighbor (KNN), random forest, extreme gradient boost (xgBoost), neural network, or deep learning, but the present disclosure is not limited thereto. By using the above-described algorithms, the machine learning model 20 may predict the yield of the semiconductor fabricating process based on parameters of the fabrication data FDAT and may predict whether a semiconductor chip or wafer to be fabricated by the semiconductor fabricating process is likely to be defective.

Figure 2:
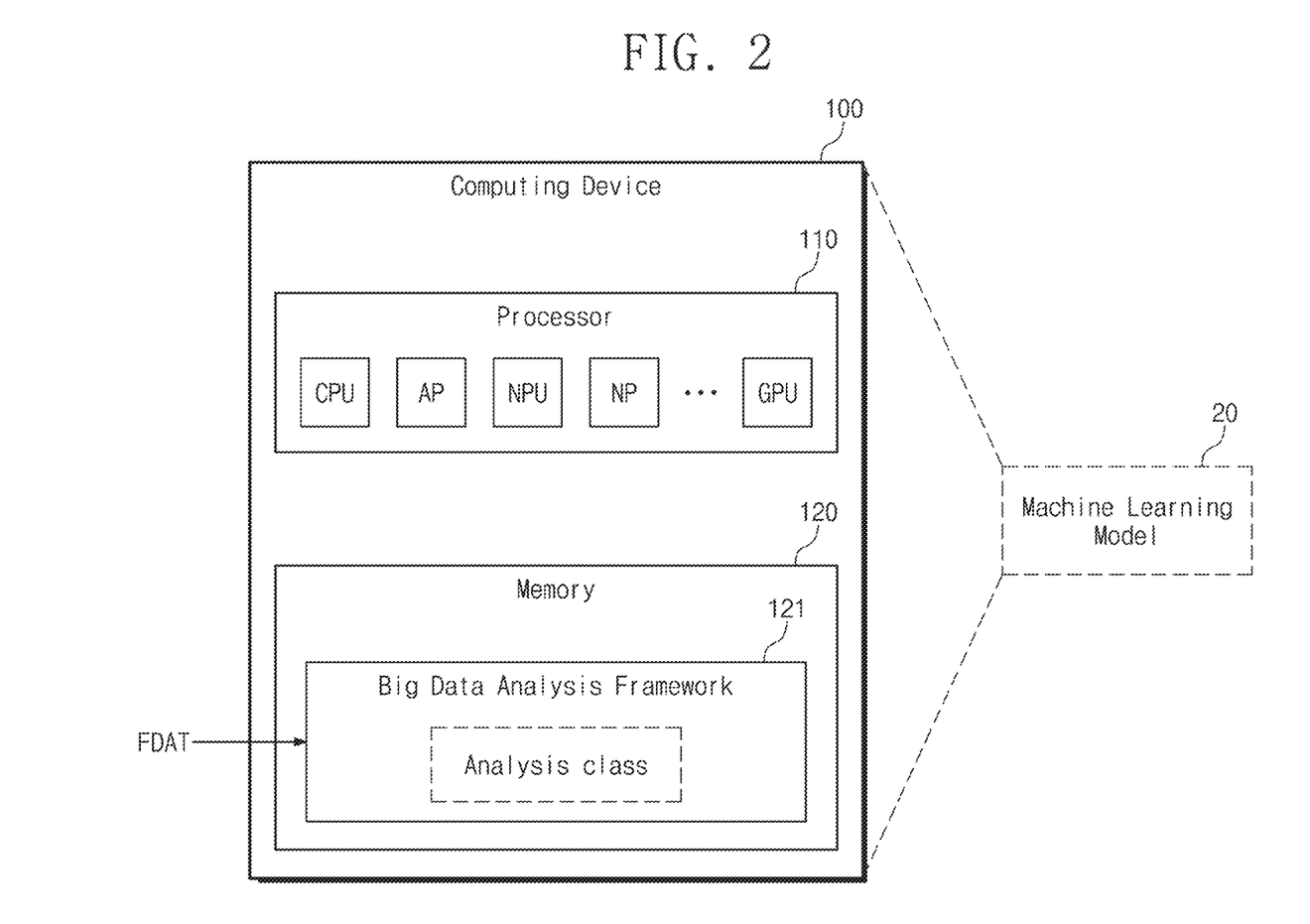
FIG. 2 is a block diagram illustrating a configuration of a computing device of FIG. 1.

FIG. 2 is a block diagram illustrating a configuration of the computing device 14 of FIG. 1. As described with reference to FIG. 1, the computing device 100 may receive the fabrication data FDAT including parameters associated with the semiconductor fabricating process, may transform the fabrication data FDAT to a format appropriate for an input to the machine learning model 20, and may execute the machine learning model 20.

As described with reference to FIG. 1, the computing device 100 may be provided with the fabrication data FDAT from the test equipment 12 (refer to FIG. 1) or may be provided with the fabrication data FDAT from the database 16 (refer to FIG. 1) storing information about semiconductor fabrication. The computing device 100 may include a processor 110 and a memory 120. The memory 120 may include a big data analysis framework 121 that transforms the fabrication data FDAT into data having a format appropriate for input to the machine learning model 20 for performing an analysis by using machine learning.

The processor 110 may execute the big data analysis framework 121 stored in the memory 120 as a hardware device. For example, the processor 110 may include homogeneous or heterogeneous cores such as a central processing unit (CPU), an image signal processing unit (ISP), a digital signal processing unit (DSP), a graphics processing unit (GPU), a vision processing unit (VPU), and a neural processing unit (NPU), a cache memory shared by the cores, and the like, but the present disclosure is not limited thereto.

The processor 110 may perform processing operations, which are associated with instructions of a program code of the big data analysis framework 121, such as fetch, execution, data request, and data store, and arithmetic operations. The number of processors included in the computing device 100 may be one or more.

The memory 120 may be a non-transitory computer-readable medium storing the program code of the big data analysis framework 121 executable by the processor 110. In an embodiment, the memory 120 may be implemented by using memory devices such as a dynamic random access memory (DRAM) device, a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access memory (PRAM) device, a magnetic random access memory (MRAM) device, and the like. The number of memories included in the computing device 100 may be one or more. Also, the memory 120 may be implemented with an external device capable of communicating with the computing device 100.

The big data analysis framework 121 may be implemented as a program code that is stored in the memory 120 and is executable by the processor 110. For example, the big data analysis framework 121 may be implemented by using a scripting language such as a Python or R program, but the present disclosure is not limited thereto. For example, the program code may be converted into bytecode that is then executed by a Python virtual machine when the scripting language is Python. For example, the big data analysis framework 121 may be implemented by using various different scripting languages.

The big data analysis framework 121 may be provided with the fabrication data FDAT from the test equipment 12 (refer to FIG. 1) or the database 16 (refer to FIG. 1) and may extract parameters from the fabrication data FDAT that are targeted for analysis. As described above, the fabrication data FDAT may include information about various parameters such as yield, BIN, ET parameter, defect, inline measurement data, FDC, machine, chamber, and process condition, and the parameters may have different data structures. For example, the parameters have different data types (e.g., integer, double, logical, and string).

Also, even though types of parameters are identical, when the parameters are based on different processes (e.g., when ET parameters are respectively based on process A and process B), names, sizes, shapes, ranges, or resolutions (i.e., a temporal resolution or a spatial resolution) of data thereof may be different. For this reason, it is difficult to apply the same machine learning algorithm to parameters extracted from the fabrication data FDAT without modification; to obtain a correlation between the parameters through machine learning or to predict the yield or defects through machine learning. Thus, it may be necessary to unify data structures and formats of the parameters.

However, because the fabrication data FDAT are big data, it is inefficient to manually unify data structures and formats of parameters whenever machine learning is performed. To solve the above issue, the big data analysis framework 121 may collectively modify data structures and formats of extracted parameters depending on the purpose of the data being analyzed. To this end, the big data analysis framework 121 of the present disclosure may generate an analysis class for analysis by using an object-oriented programming (OOP) technique.

Figure 3:
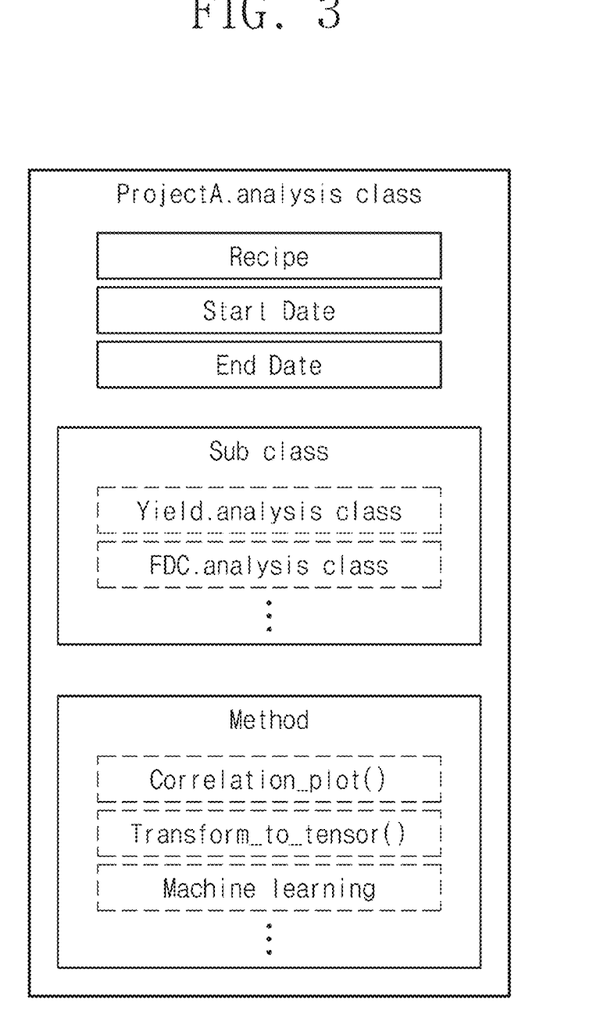
FIG. 3 conceptually illustrates an example of a class generated according to an embodiment of the present disclosure.

FIG. 3 conceptually illustrates an example of a class generated according to an embodiment of the present disclosure. Below, FIG. 3 will be described together with FIG. 2. The big data analysis framework 121 may generate a class corresponding to the semiconductor fabricating process, and the class may include a recipe, a start date, and an end date of a fabricating process as a label. A class is a template for objects. For example, the objects are instances of the class. For example, the recipe could be different among objects of the class even though all the objects include a recipe. The recipe may include a series of steps performed to fabricate a given semiconductor device.

For example, a class for fabricating process A may be generated to be named "ProjectA.analysis" and to include the recipe, start date, and end date of fabricating process A, and a class for fabricating process B may be generated to be named "ProjectB.analysis" and to include the recipe, start date, and end date of fabricating process B. For brevity of drawing, only "ProjectA.analysis" that is the class for fabricating process A is illustrated in FIG. 3, and classes for other fabricating processes may have a configuration similar to that of the class "ProjectA.analysis".

The generated class may include sub classes for analyzing a specific parameter (e.g., a yield parameter). The sub class may store different parameters (e.g., different parameters associated with yield) necessary for analysis of the specific parameter depending on a given structure and format. In detail, even though parameters of the same kind are associated with different fabricating processes, the parameters of the same kind may be modified to have the same data structure and format and may be stored in a class.

For example, a class for analyzing the yield may be generated with a name of "yield.analysis", and a class for analyzing the FDC may be generated with a name of "FDC.analysis". As described above, all parameters of the same kind may be stored in the "yield.analysis" class, which is a sub class of the "ProjectA.analysis" class associated with fabricating process A, and the "yield.analysis" class, which is a sub class of the "ProjectB.analysis" class associated with fabricating process B, depending on the same data structure and format.

Each of the generated classes and sub classes may have a method for processing and analyzing data included therein. The sub class may use a method, which a superclass has, without modification, which is called "inheritance" from the point of view of object-oriented programming. Referring to FIG. 3, the "yield.analysis" and "FDC.analysis" classes may inherit and use the method of the "ProjectA.analysis" or "ProjectB.analysis" class without modification.

For example, a class may include a method "correlation_plot( )" that calculates a correlation coefficient (e.g., a Pearson correlation coefficient) between two parameters, a method "transform_to_tensor( )" that transforms data to a tensor appropriate for an input to a machine learning model, and a method "machine learning" that executes a machine learning model based on a specific machine learning algorithm (e.g., SVM or random forest).

By an operation of the big data analysis framework 121 based on the above-described class and method, there may be no need to implement individual codes (e.g., a code for calculating a correlation coefficient, a code for transforming data to a tensor, and a code for applying a specific machine learning algorithm) depending on kinds of parameters to be analyzed, data structures, and data types, and the efficiency of processing and analysis of the fabrication data FDAT may increase. A process of analyzing data by using various methods will be described in more detail with reference to FIG. 6.

Figure 4:
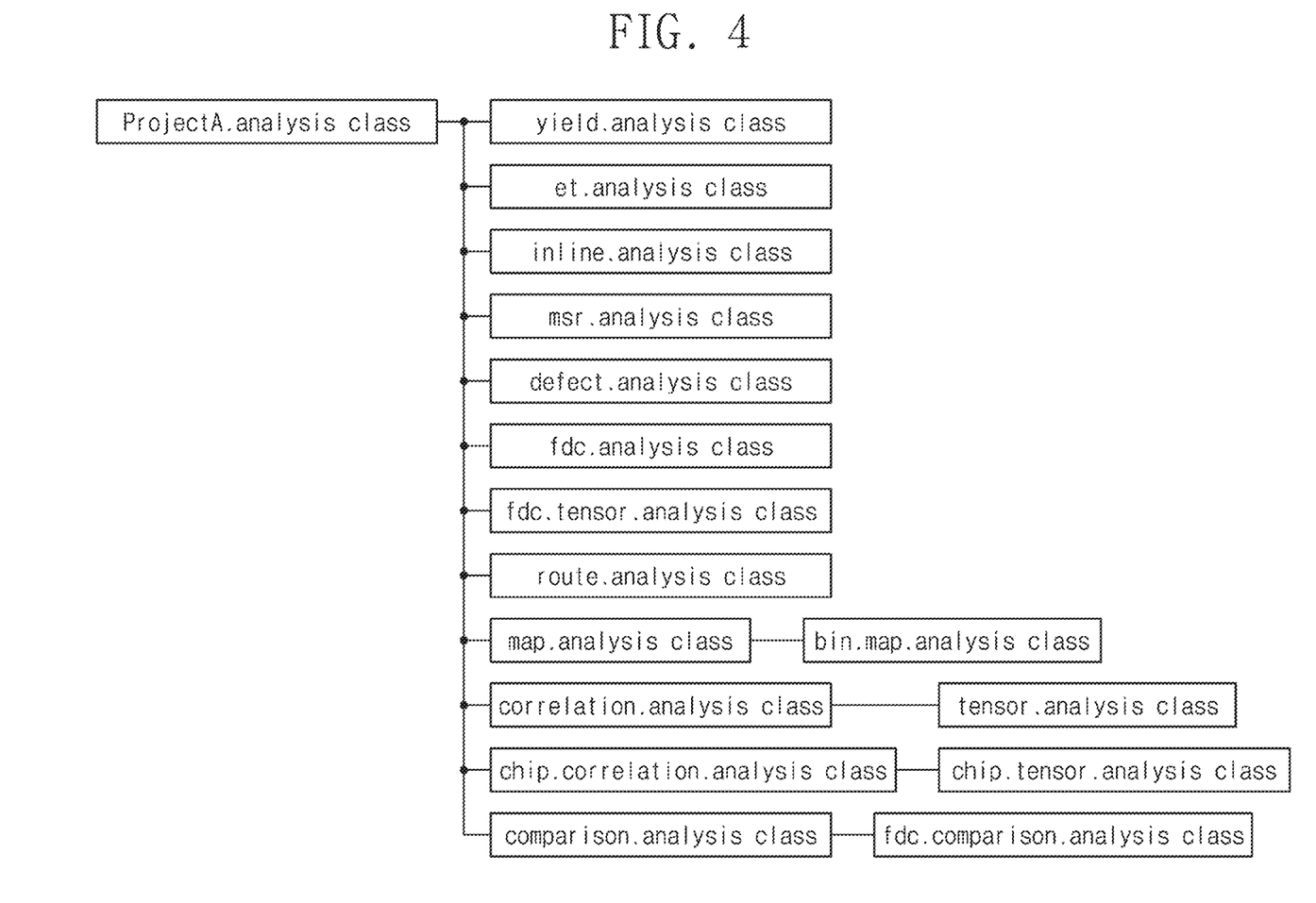
FIG. 4 illustrates an example of a hierarchical diagram of a class generated according to an embodiment of the present disclosure.

FIG. 4 illustrates an example of a hierarchical diagram of a class generated according to an embodiment of the present disclosure. A hierarchical diagram represents the flow of data that are processed between classes. As described with reference to FIG. 3, the big data analysis framework 121 may generate a class for the semiconductor fabricating process, and the class for the fabricating process (e.g., the "ProjectA.analysis" class of FIG. 3) may include sub classes for parameters associated with the process.

For example, a class for a fabricating process may include a "yield.analysis" class for analyzing yield, an "et.analysis" class for analyzing ET parameters, an "inline.analysis" class for analyzing inline measurement data, an "msr.analysis" class for analyzing various measures (MSR) associated with a test sequence determining whether products are good or bad, a "defect.analysis" class for analyzing whether a defect exists, a "fdc.anaysis" class for analyzing FDC, a "route.analysis" class for analyzing a route, a "map.analysis" class for analyzing a wafer map, and a "bin.map.analysis" class for analyzing a wafer BIN map, as sub classes. The wafer bin map may represent a specific defect pattern that provides information for diagnosing the root causes of low yield in a semiconductor manufacturing.

In addition, the big data analysis framework 121 may include a "tensor.analysis" class (e.g., an "fdc.tensor.analysis" class) for transforming data into a matrix or tensor, and for analyzing tensor-type data. Also, the class for the fabricating process may include a "correlation.analysis" class and a "comparison.analysis" class (e.g., an "fdc.comparison.analysis" class) for correlation analysis and comparative analysis between parameters. In addition, the class for the fabricating process may include a "chip.correlation.analysis" class and a "chip.tensor.analysis" class for chip-level analysis (e.g., analysis of parameters associated with a semiconductor chip on a wafer).

Figure 5:
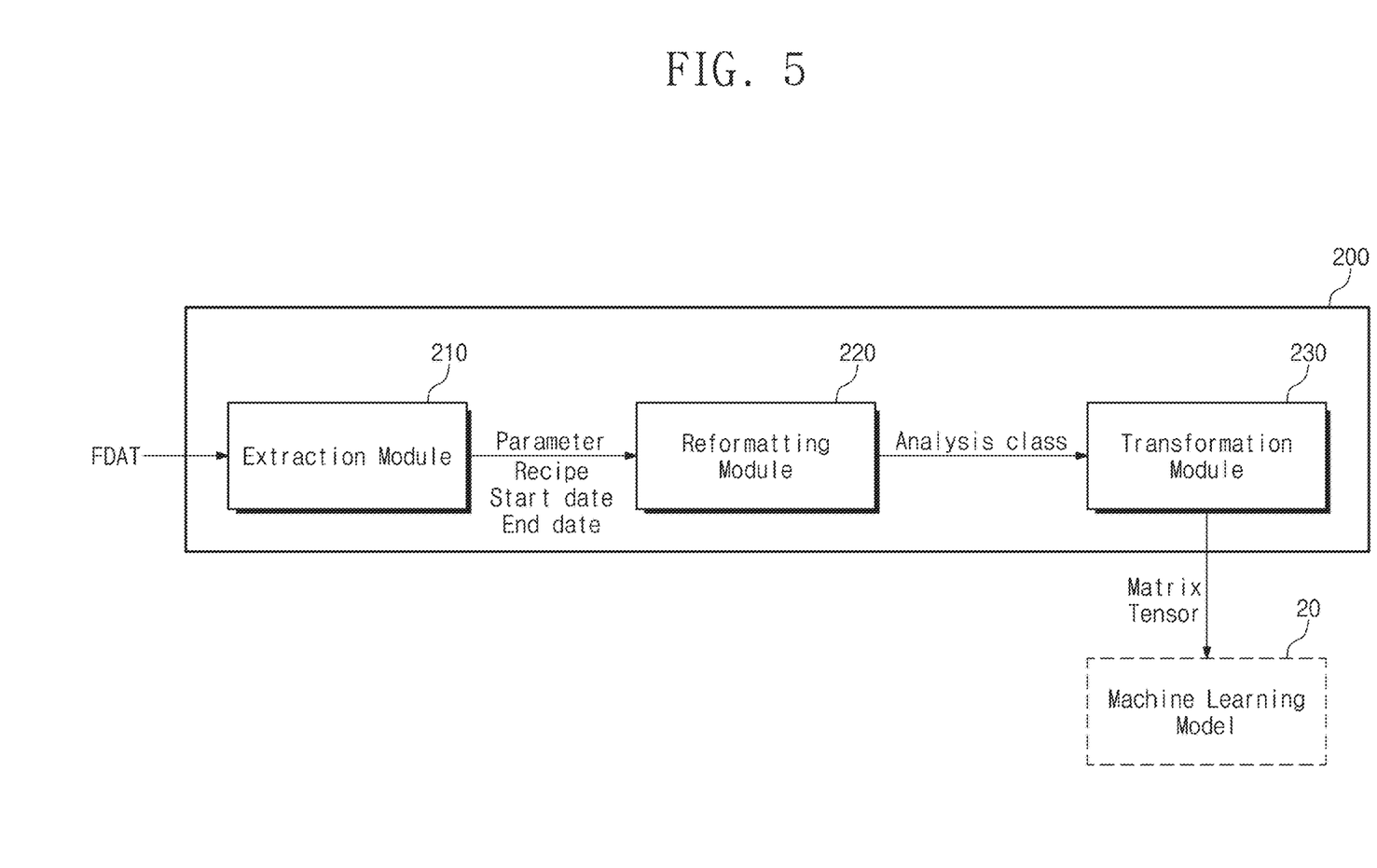
FIG. 5 is a block diagram illustrating a configuration of a big data analysis framework according to an embodiment of the present disclosure.

FIG. 5 is a block diagram illustrating a configuration of a big data analysis framework 200 according to an embodiment of the present disclosure. For example, the big data analysis framework 200 may be the big data analysis framework 121 of FIG. 2 and may include an extraction module 210, a reformatting module 220, and a transformation module 230. As described with reference to FIGS. 1 and 2, the big data analysis framework 200 may be implemented as a program code based on a scripting language such as a Python or R program.

However, the present disclosure is not limited thereto. For example, the big data analysis framework 200 may have a configuration different from the configuration illustrated in FIG. 5 and may be implemented as a program code based on any other object-oriented language in addition to Python or R.

The extraction module 210 may receive the fabrication data FDAT and may extract parameters targeted for analysis from the received fabrication data FDAT. For example, the extraction module 210 may be implemented as a program code that is capable of fetching big data (i.e., the fabrication data FDAT), searching for data (e.g., data corresponding to yield, data corresponding to FDC, or data corresponding to BIN) in the big data corresponding to a user-desired parameter, and storing the found data separately.

The reformatting module 220 may modify a data structure and format such that a parameter extracted from the extraction module 210 is stored in a class. The reformatting module 220 may be implemented as a program code capable of transforming a structure and a format of data extracted from the extraction module 210 so as to be stored in a class. The big data analysis framework 200 may calculate a correlation between parameters associated with a fabricating process by using various methods for data stored in the class and may perform analysis such as visualization.

The transformation module 230 may transform parameters to be applied to a machine learning algorithm from among the parameters stored in the class in the form of a matrix or tensor. For example, the transformation module 230 may be implemented as a program code capable of transforming a dimension of the data (e.g., from one-dimensional data to a two-dimensional matrix or a three-dimensional tensor) while maintaining contents of the data. The big data analysis framework 200 may provide the matrix or tensor-type data generated by the transformation module 230 to the machine learning model 20 to train the machine learning model 20, or may predict the yield or defects of the fabricating process by using a machine learning algorithm.

Accordingly, since the big data analysis framework 200 according to an embodiment of the present disclosure is used, there is no need to implement a program code for data processing, analysis, and transformation individually with regard to a parameter requiring analysis for each fabricating process, and data processing and analysis and machine learning-based prediction may be performed only by selecting a parameter and a fabricating process targeted for analysis. In addition, the big data analysis framework 200 may include modules for performing various data processing and analysis in addition to the extraction module 210, the reformatting module 220, and the transformation module 230 illustrated in FIG. 5.

Figure 6:
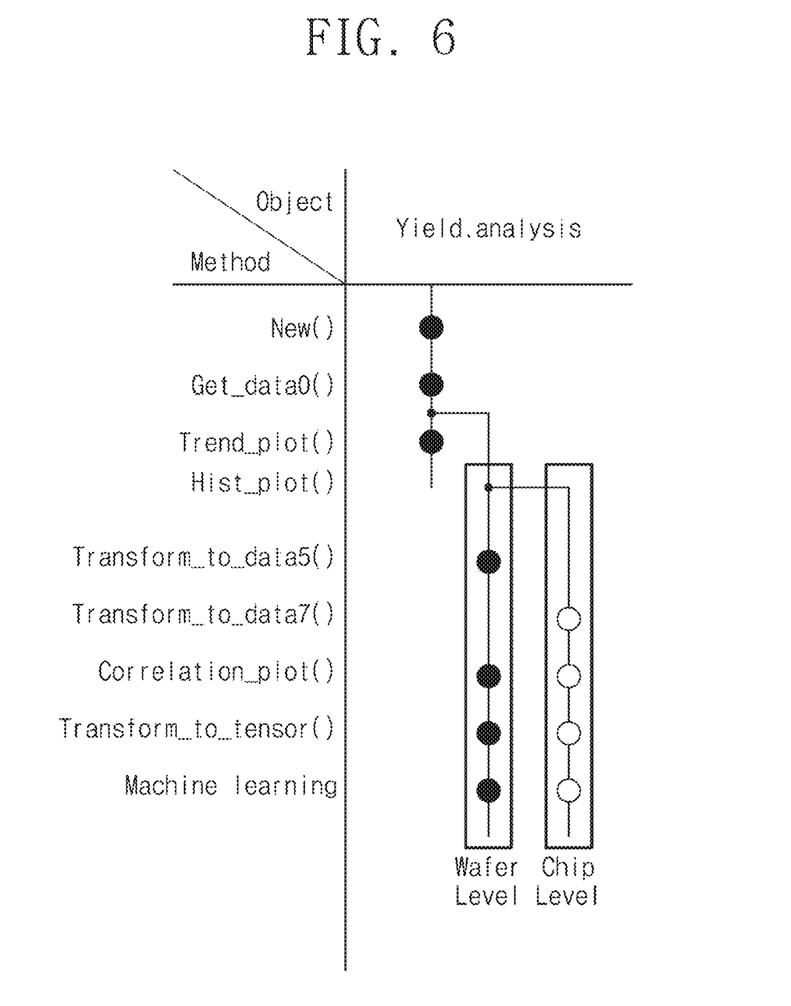
FIG. 6 conceptually illustrates a process of analyzing data based on a class and a method according to an embodiment of the present disclosure.

FIG. 6 conceptually illustrates a process of analyzing data based on a class and a method according to an embodiment of the present disclosure. For brevity of illustration and convenience of description, a process of analyzing data of the "yield.analysis" class and the method is illustrated in FIG. 6 as an example. Below, FIG. 6 will be described together with FIG. 2.

First, to analyze the yield of a semiconductor fabricating process, the big data analysis framework 121 may generate a class "yield.analysis" for analyzing the yield by using a "new( )" method. The "new( )" method may be used to generate an object or an instance of the class. Next, parameters associated with the yield of the fabricating process to be analyzed may be extracted from the fabrication data FDAT by using a "get_data0( )" method, and the extracted parameters may be stored in the "yield.analysis" class or in an instance of the class. For example, the "get_data0( )" method may be performed by the extraction module 210 of FIG. 5. Also, the operation of the reformatting module 220 of FIG. 5 may be performed to store the parameters associated with the yield in the "yield.analysis" class or in the instance of the class.

After all data are extracted, the big data analysis framework 121 may visually represent the trend of all the parameters associated with the yield by using a "trend_plot( )" method. For example, the big data analysis framework 121 may represent the trend of the parameters through a histogram by using a "hist_plot( )" method.

After representing and figuring out the trend, the big data analysis framework 121 may perform data analysis at a wafer level or at a chip level. For example, in the case of analyzing data at a wafer level, the big data analysis framework 121 may transform the data stored in the class in the form of a matrix available for the wafer-level analysis, by using a "transform_to_data5( )" method.

In contrast, in the case of analyzing data at a chip level, the big data analysis framework 121 may transform the data stored in the class in the form of a matrix available for the chip-level analysis, by using a "transform_to_data7( )" method. The data transformed in the form of a matrix may be used to obtain a correlation (e.g., a Pearson correlation coefficient) between parameters by a "correlation_plot" method. The data transformed in the form of a matrix may be provided as an input for training or analysis of the machine learning model 20.

In addition, the big data analysis framework 121 may transform data in the form of a tensor by using a "transform_to_tensor( )" method. The data transformed in the form of a tensor may be provided as an input for training or analysis of the machine learning model 20. For example, the big data analysis framework 121 may include a program code capable of executing the machine learning model 20 based on various machine learning algorithms (e.g., SVM, KNN, and random forest). For example, the "transform_to_data5( )", "transform_to_data7( )", and "transform_to_tensor( )" methods described above may be performed by the transformation module 230 of FIG. 5.

Figure 7:
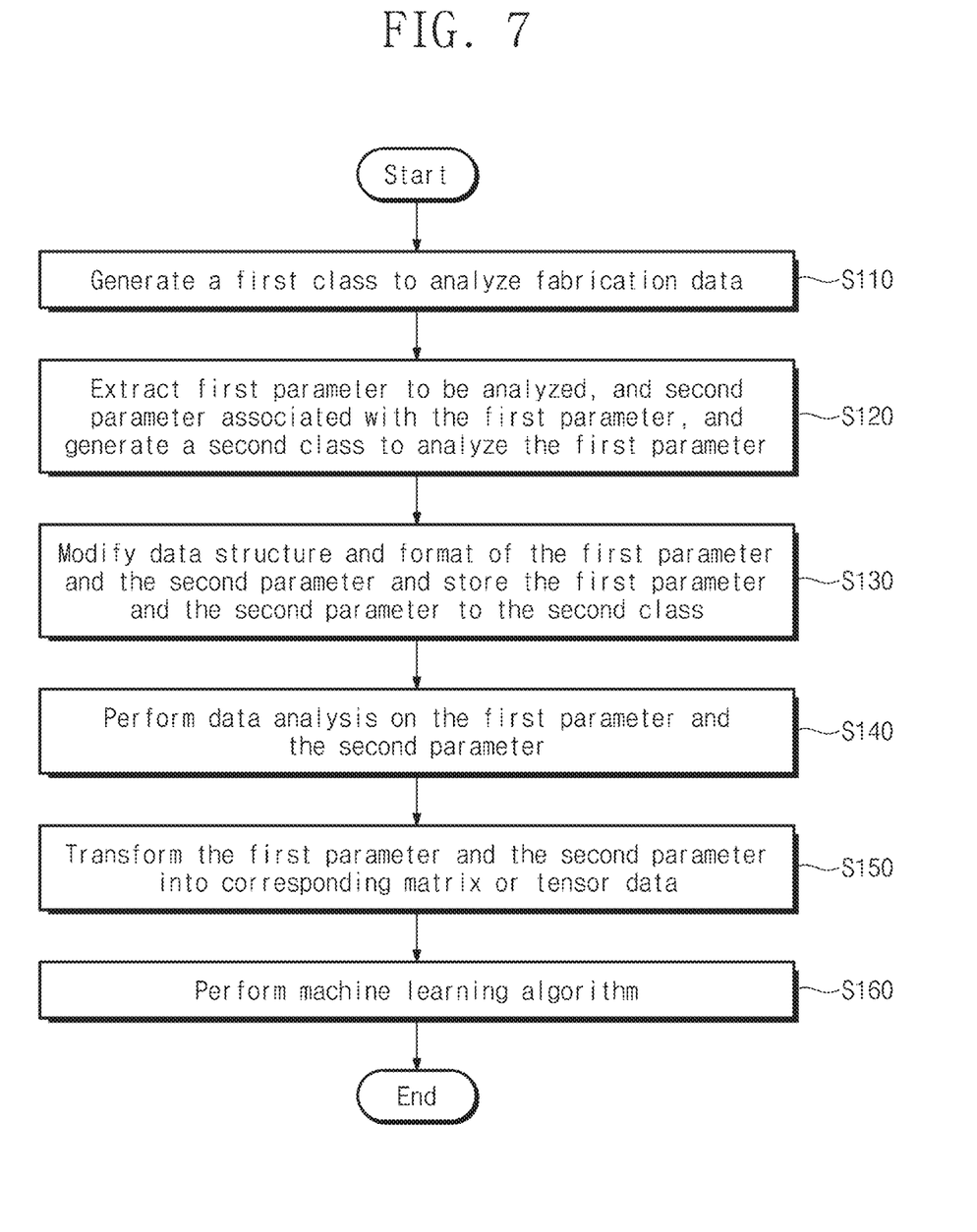
FIG. 7 is a flowchart illustrating a method of performing big data analysis for semiconductor fabrication according to an embodiment of the present disclosure.

FIG. 7 is a flowchart illustrating a method of performing big data analysis for semiconductor fabrication according to an embodiment of the present disclosure. Below, FIG. 7 will be described together with FIG. 2.

In operation S110, the big data analysis framework 121 generates a first class for analyzing data associated with a semiconductor fabricating process. For example, the big data analysis framework 121 may generate the "ProjectA.analysis" class associated with fabricating process A as the first class.

In operation S120, the big data analysis framework 121 may extract a first parameter targeted for analysis and a second parameter associated with the first parameter from the fabrication data FDAT and may generate a second class for analyzing the first parameter as a sub class of the first class.

For example, the big data analysis framework 121 may generate a "yield.analysis" class for analyzing yield and a "et.analysis" class for analyzing an ET parameter as a sub class of "ProjectA.analysis" (i.e., the second class) and may extract the remaining parameters (i.e., the second parameter) associated with the yield or ET parameter (i.e., the first parameter). For example, operation S120 may be performed by the extraction module 210 of FIG. 5.

In operation S130, the big data analysis framework 121 modifies data structures of the extracted first and second parameters into a data structure having a format appropriate to store in a class, so as to be stored in the second class. For example, operation S130 may be performed by the reformatting module 220 of FIG. 5.

In operation S140, the big data analysis framework 121 performs analysis on the first parameter and the second parameter stored in the second class by using a method. For example, the big data analysis framework 121 may calculate a correlation between parameters. For example, the correlation may be performed on a first part of the data structure of the second class storing the first parameter and a second part of the data structure of the second class storing the second parameter. In operation S150, the big data analysis framework 121 transforms the first parameter and the second parameter into matrix data or tensor data for the purpose of performing machine learning when the correlation between the parameters exceeds a predetermined threshold. For example, operation S150 may be performed by the transformation module 230 of FIG. 5.

In operation S160, the big data analysis framework 121 may input the matrix data or the tensor data to a machine learning model to perform a machine learning algorithm. To this end, the big data analysis framework 121 may include a program code for executing the machine learning model 20. For example, the machine learning model 20 may predict the yield or defects of the semiconductor fabricating process by applying a machine learning algorithm, such as SVM, KNN, or random forest, to the matrix data or the tensor data.

Figure 8A:
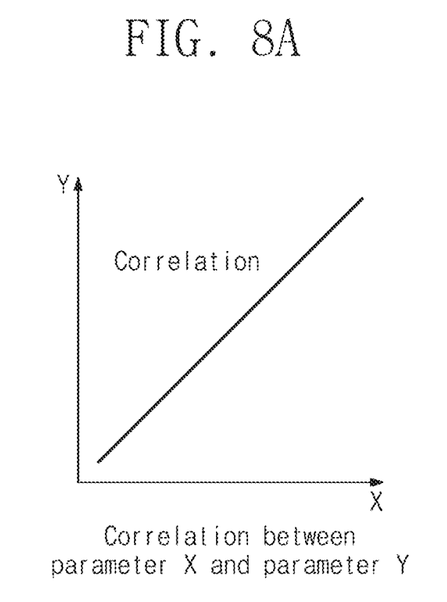
FIGS. 8A to 8C illustrate examples of a result of data analysis and results capable of being output by a machine learning model, according to an embodiment of the present disclosure.
Figure 8B:
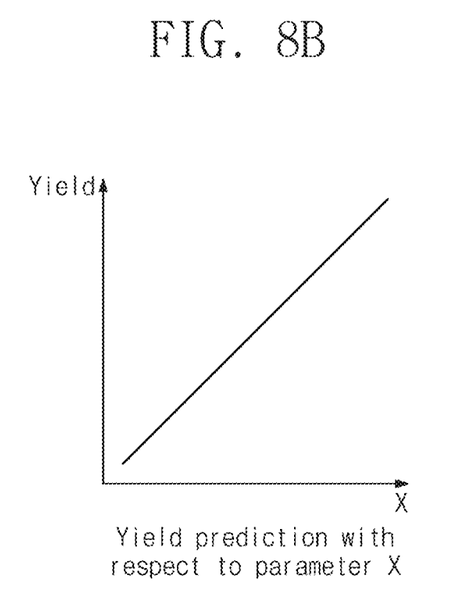
Figure 8C:
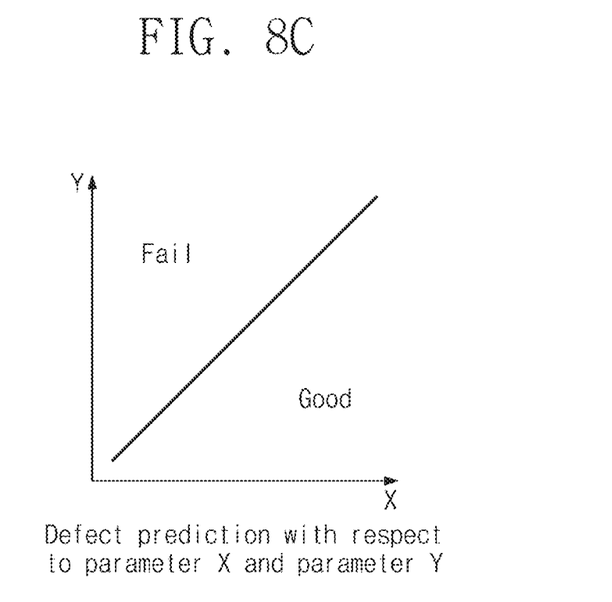

FIGS. 8A to 8C illustrate examples of a result of data analysis and results capable of being output by a machine learning model, according to an embodiment of the present disclosure. Below, FIGS. 8A to 8C will be described together with FIG. 2.

The big data analysis framework 121 according to an embodiment of the present disclosure may calculate a correlation (e.g., a Pearson correlation coefficient) between parameter X (first parameter) and parameter Y (second parameter) and may represent a calculated result as illustrated in FIG. 8A.

Also, the big data analysis framework 121 may execute the machine learning model 20 to predict the yield of a fabricating process according to parameter X and may represent a predicted result as illustrated in FIG. 8B. For example, to predict the yield of the fabricating process, the machine learning model 20 may use a random forest algorithm.

In addition, the big data analysis framework 121 may execute the machine learning model 20 to predict defects of the fabricating process according to parameter X and parameter Y and may represent a predicted result as illustrated in FIG. 8C. In an embodiment, when it is determined that parameter X does not correlate sufficiently with parameter Y, the prediction is not performed according to parameter X and parameter Y. For example, the above-described parameters can be re-performed with respect to parameters X and another parameter related to parameter such a parameter Z. For example, to predict the defects of the fabricating process, the machine learning model 20 may use an SVM algorithm. For example, a semiconductor chip that is fabricated according to parameter X and parameter Y and is present above a straight line of FIG. 8C may be a fail chip, and a semiconductor chip that is fabricated according to parameter X and parameter Y and is present below the straight line of FIG. 8C may be a good chip. For example, if a chip is to be manufactured to have parameter X set to a first value and parameter Y set to a second value, and a point is plotted on the graph of FIG. 8C with the first and second values as coordinates of the point, the chip is good when the point is positioned below the line and defective when positioned above the line.

Figure 9:
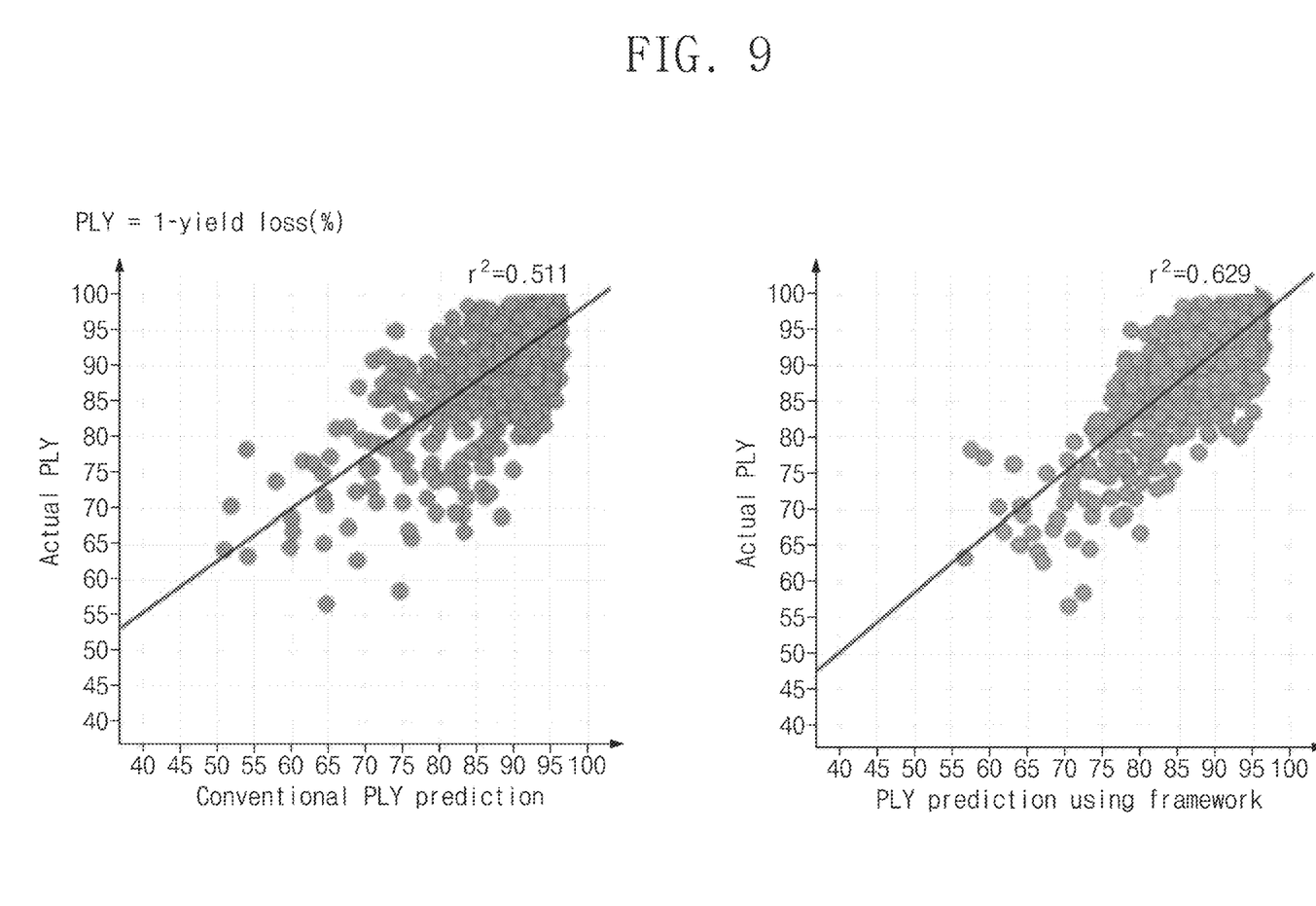
FIG. 9 illustrates a result of predicting yield, according to an embodiment of the present disclosure.

FIG. 9 illustrates a result of predicting yield, according to an embodiment of the present disclosure. Referring to FIG. 9, a value that is obtained by subtracting a yield loss value from "1" may be defined as a PLY value, and a result of predicting yield may be represented according to the PLY value.

As illustrated in FIG. 9, the accuracy ($r^2$=0.629) that is obtained when the PLY value is predicted by using the big data analysis framework 121 (refer to FIG. 2) is higher than the accuracy ($r^2$=0.511) obtained when the PLY value is predicted according to a conventional method. That is, according to an embodiment of the present disclosure, the efficiency of data analysis associated with a semiconductor fabricating process may increase, and the performance of data analysis may also increase.

According to an embodiment of the present disclosure, it may be possible to perform format modification for extraction, processing, analysis, and machine learning of data, and analysis through machine learning by using a single framework.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A non-transitory computer-readable medium storing program code for optimizing a semiconductor fabricating process, the program code including a framework and a machine learning model, the program code, when executed by a processor, causing the processor to:
input fabrication data including a plurality of parameters associated with the semiconductor fabricating process to the framework to generate a first class for analyzing the fabrication data, wherein the parameters are different from one another;
extract a first parameter targeted for analysis a second parameter associated with the first parameter from the plurality of parameters to generate a second class for analyzing the first parameter as a sub class of the first class;
modify the first parameter and the second parameter into a data structure having a format appropriate for storage in the second class;
perform data analysis on the data structure to calculate a correlation between the first parameter and the second parameter;
transform the first parameter and the second parameter into a tensor when the correlation exceeds a threshold and otherwise transform the first parameter and a third parameter of the parameters associated with the first parameter into the tensor;
input the tensor to the machine learning model to perform a machine learning algorithm for predicting a characteristic of the semiconductor fabricating process; and
change the semiconductor fabricating process based on the predicted characteristic.

2. The non-transitory computer-readable medium of claim 1, wherein the plurality of parameters include a yield parameter, a bin parameter, an electrical test (ET) parameter, a defect parameter, inline measurement data, a false detection and classification (FDC), machine information, chamber information, or recipe information.

3. The non-transitory computer-readable medium of claim 1, wherein the tensor is a matrix.

4. The non-transitory computer-readable medium of claim 1, wherein the correlation is calculated by using a Pearson correlation coefficient.

5. The non-transitory computer-readable medium of claim 1, wherein the machine learning algorithm includes a support vector machine (SVM), a k-nearest neighbor (KNN), or a random forest.

6. The non-transitory computer-readable medium of claim 1, wherein the processor further trains the machine learning model by inputting the tensor to the machine learning model.

7. The non-transitory computer-readable medium of claim 1, wherein the first parameter is a yield parameter, and the characteristic is a yield of the semiconductor fabricating process.

8. The non-transitory computer-readable medium of claim 1, wherein the first parameter is a defect parameter, and the characteristic is a defect of the semiconductor fabricating process.

9. A computing device for optimizing a semiconductor fabricating process, the computing device comprising:
a processor; and
a memory,
wherein the memory stores a program code including a framework and a machine learning model, wherein the program code, when executed by the processor, causes the processor to:
input fabrication data including a plurality of parameters associated with the semiconductor fabricating process to the framework to generate a first class for analyzing the fabrication data, wherein the parameters are different from one another;
extract a first parameter targeted for analysis and a second parameter associated with the first parameter from the plurality of parameters to generate a second class for analyzing the first parameter as a sub class of the first class;
modify the first parameter and the second parameter into a data structure having a format appropriate for storage in the second class;
perform data analysis on the data structure to calculate a correlation between the first parameter and the second parameter;
transform the first parameter and the second parameter into a tensor when the correlation exceeds a threshold and otherwise transform the first parameter and a third parameter of the parameters associated with the first parameter into the tensor;

input the tensor to the machine learning model to perform a machine learning algorithm for predicting a characteristic of the semiconductor fabricating process; and
change the semiconductor fabricating process based on the predicted characteristic.

10. The computing device of claim 9, wherein the plurality of parameters include a yield parameter, a bin parameter, an electrical test (ET) parameter, a defect parameter, inline measurement data, a false detection and classification (FDC), machine information, chamber information, or recipe information.

11. The computing device of claim 9, wherein the fabrication data include a gate-induced drain leakage (GIDL), a drain-induced barrier lowering (DIBL), a current, a power, an operating frequency, a threshold voltage, a latency, a timing margin, or a lifetime.

12. The computing device of claim 9, wherein the tensor is a matrix.

13. The computing device of claim 9, wherein the correlation is calculated by using a Pearson correlation coefficient.

14. The computing device of claim 9, wherein the machine learning algorithm includes a support vector machine (SVM), a k-nearest neighbor (KNN), or a random forest.

15. A method for optimizing a semiconductor fabricating process, the method comprising:
    generating a first class for analyzing fabrication data including a plurality of parameters associated with the semiconductor fabricating process, wherein the parameters are different from one another;
    extracting a first parameter targeted for analysis and a second parameter associated with the first parameter from the plurality of parameters to generate a second class for analyzing the first parameter as a sub class of the first class;
    modifying the first parameter and the second parameter into a data structure having a format appropriate for storage in the second class;
    performing data analysis on the data structure to calculate a correlation between the first parameter and the second parameter;
    transforming the first parameter and the second parameter into a tensor when the correlation exceeds a threshold and otherwise transforming the first parameter and a third parameter of the parameters associated with the first parameter into the tensor;
    performing a machine learning algorithm by inputting the tensor to the machine learning model for predicting a characteristic of the semiconductor fabricating process; and changing the semiconductor fabricating process based on the predicted characteristic.

16. The method of claim 15, wherein the plurality of parameters include a yield parameter, a bin parameter, an electrical test (ET) parameter, a defect parameter, inline measurement data, a false detection and classification (FDC), machine information, chamber information, or recipe information.

17. The method of claim 15, wherein the tensor is a matrix.

18. The method of claim 15, wherein the correlation is calculated by using a Pearson correlation coefficient.

19. The method of claim 15, further comprising: training the machine learning model by inputting the tensor to the machine learning model.

20. The method of claim 15, wherein the machine learning algorithm includes a support vector machine (SVM), a k-nearest neighbor (KNN), or a random forest.

* * * * *